United States Patent
Brewer et al.

(10) Patent No.: US 11,715,722 B2
(45) Date of Patent: Aug. 1, 2023

(54) WIREBOND-CONSTRUCTED INDUCTORS

(71) Applicant: Cree, Inc., Durham, NC (US)

(72) Inventors: Kenneth P. Brewer, Mesa, AZ (US); Warren Brakensiek, Phoenix, AZ (US)

(73) Assignee: WOLFSPEED, INC., Durham, NC (US)

( * ) Notice: Subject to any disclaimer, the term of this patent is extended or adjusted under 35 U.S.C. 154(b) by 446 days.

(21) Appl. No.: 16/863,188

(22) Filed: Apr. 30, 2020

(65) Prior Publication Data
US 2021/0343679 A1 Nov. 4, 2021

(51) Int. Cl.
 *H01L 23/00* (2006.01)
 *H01L 23/64* (2006.01)
 *H01L 23/522* (2006.01)

(52) U.S. Cl.
 CPC .......... *H01L 24/85* (2013.01); *H01L 23/5227* (2013.01); *H01L 23/645* (2013.01);
 (Continued)

(58) Field of Classification Search
 CPC ......... H01L 24/85; H01L 24/45; H01L 24/43; H01L 23/645; H01L 24/03; H01L 23/5227; H01L 24/05; H01L 23/00; H01L 23/64; H01L 23/522; H01L 23/48; H01L 24/48; H01L 2224/48091; H01L 2224/48998; H01L 2224/45099; H01L 2924/19107;
 (Continued)

(56) References Cited

U.S. PATENT DOCUMENTS 6,885,275 B1 * 4/2005 Chang ................ H03J 3/185
 336/200
8,907,467 B2 12/2014 Komposch et al.
 (Continued)

FOREIGN PATENT DOCUMENTS

CA 2915155 C * 9/2019 ....... H01L 23/49506
CN 1669139 A * 9/2005 ............ H01L 24/49
 (Continued)

OTHER PUBLICATIONS

PICONICS, "Micro CCM Broadband Conical Inductor", Product data sheet, Jan. 1, 2019, pp. 1-2, obtained on Mar. 6, 2020, obtained from Internet: http://www.piconics.com/wp-content/uploads/2019/05/Micro-CCM-Conical-data-sheet-Rev-B.pdf.

*Primary Examiner* — Alexander O Williams
(74) *Attorney, Agent, or Firm* — Coats & Bennett, PLLC

(57) ABSTRACT

Fabrication of a bondwire inductor between connection pads of a semiconductor package using a wire bonding process is disclosed herein. To that end, the bondwire inductor is fabricated by extending a bondwire connecting two connection pads of the semiconductor package around a dielectric structure, e.g., a dielectric post or posts, disposed between the connection pads a defined amount. In so doing, the bondwire inductor adds inductance between the connection pads, where the added inductance is defined by factors which at least include the amount the bondwire extends around the dielectric structure. Such additional inductance may be particularly beneficial for certain semiconductor devices and/or circuits, e.g., monolithic microwave integrated circuits (MMICs) to control or supplement impedance matching, harmonic termination, matching biasing, etc.

18 Claims, 11 Drawing Sheets

(52) U.S. Cl.
CPC .............. *H01L 24/03* (2013.01); *H01L 24/05* (2013.01); *H01L 24/43* (2013.01); *H01L 24/45* (2013.01)

(58) Field of Classification Search
CPC ..... H01L 2924/181; H01L 2924/00014; H01L 2924/1423; H01L 2924/19042; H01L 2924/19105; H01L 2924/00012; H01F 5/02; H01F 27/2823
USPC ....................................................... 257/531
See application file for complete search history.

(56) References Cited

U.S. PATENT DOCUMENTS

| | | | |
|---|---|---|---|
| 9,472,480 B2 | 10/2016 | Wood et al. | |
| 2002/0142512 A1* | 10/2002 | Ma | H01L 23/5227 438/100 |
| 2007/0003781 A1* | 1/2007 | de Rochemont | H01C 17/06533 428/615 |
| 2007/0139976 A1* | 6/2007 | deRochemont | H01C 7/003 363/17 |
| 2011/0227689 A1* | 9/2011 | Chang | H01L 23/5227 336/200 |
| 2013/0056847 A1* | 3/2013 | Chen | H01F 17/0013 257/E29.325 |
| 2020/0119254 A1* | 4/2020 | Jinka | H01L 39/223 |
| 2021/0203278 A1* | 7/2021 | Wei | H01L 24/49 |

FOREIGN PATENT DOCUMENTS

| | | | | |
|---|---|---|---|---|
| CN | 100423255 C | * | 10/2008 | ............. H01L 24/49 |
| CN | 101484957 A | * | 7/2009 | ........... H05K 3/4611 |
| CN | 101213638 B | * | 7/2011 | ............ H01L 23/642 |
| CN | 101553891 B | * | 2/2013 | ........... H01F 27/292 |
| CN | 211788976 U | * | 10/2020 | ... H01L 2224/33181 |
| JP | S625618 A | * | 1/1987 | ............. H01F 15/10 |
| JP | H07272937 A | * | 10/1995 | ............. H01P 15/10 |
| JP | 2006525672 A | * | 11/2006 | ............. H01L 24/72 |
| JP | 2013522955 A | * | 6/2013 | ........... H01L 23/522 |
| WO | 2651000 A1 | * | 11/2007 | ........... A61B 5/0215 |
| WO | 2008156565 A1 | * | 12/2008 | ........... H01I 23/481 |
| WO | 2014/145687 A1 | * | 9/2014 | ............... H03H 7/40 |

* cited by examiner

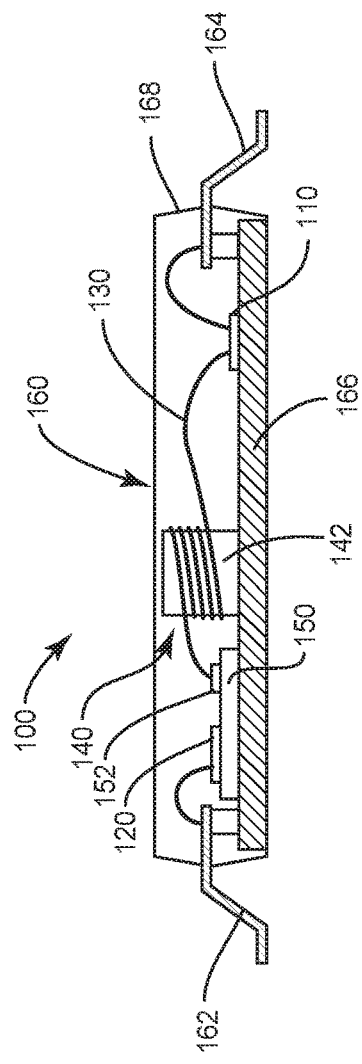
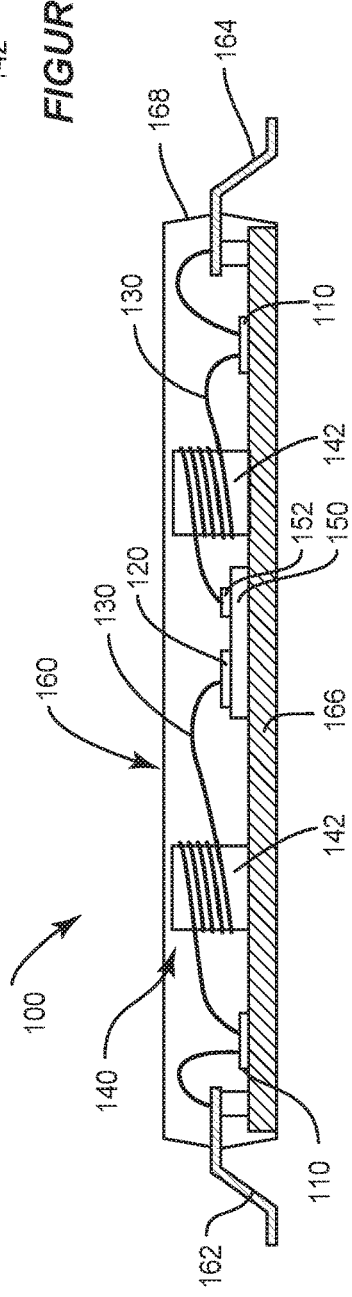
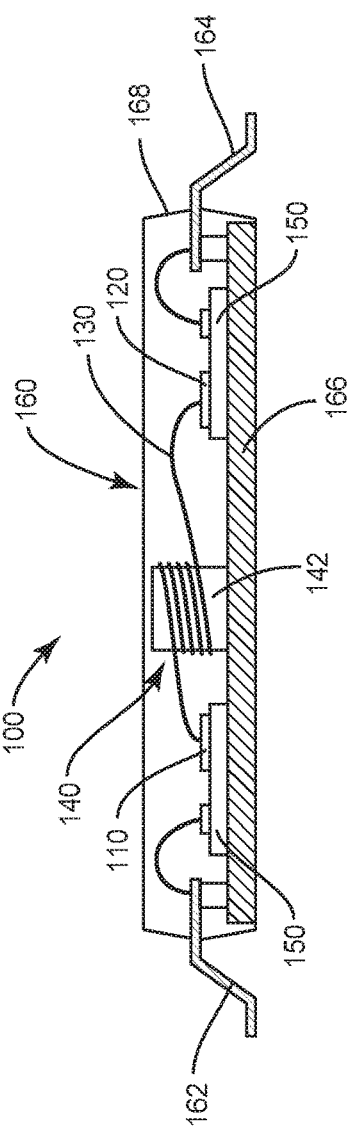

WIREBOND-CONSTRUCTED INDUCTORS

BACKGROUND

Semiconductor packaging, which is generally constructed from metal, plastic, glass, and/or ceramic, contains one or more components, e.g., semiconductor devices, integrated circuits, integrated passive devices, etc. The component(s) in the semiconductor package are configured to implement one or more functions to control an electronic device, process data/signals, generate communication signals, etc. The semiconductor package protects these component(s) from external threats, e.g., mechanical stresses, chemical contamination, moisture, etc., while providing a connection for the component(s) to external circuitry, processors, heat sinks, etc.

A semiconductor package generally includes multiple connection pads that not only may connect the component(s) to external circuitry, but also may provide internal connections for the component(s). Manipulating the impedance between connections may help optimize the performance of the component(s) of the semiconductor package or the system as a whole. As the size of semiconductor packaging continues to shrink, however, incorporating the desired impedances becomes increasingly difficult, particularly in desired locations. Thus, there remains a need for improved semiconductor packaging manufacturing techniques.

SUMMARY

The solution presented herein adds a bondwire inductor between connection pads of a semiconductor package. To that end, the solution presented herein fabricates the bondwire inductor by wrapping a bondwire connecting two connection pads of the semiconductor package around a dielectric structure, e.g., a dielectric post or posts, disposed between the connection pads. In so doing, the bondwire inductor adds inductance between the connection pads, where the added inductance is defined by factors which at least include the amount the bondwire extends around the dielectric structure. Such additional inductance may be particularly beneficial for certain semiconductor devices and/or circuits, e.g., monolithic microwave integrated circuits (MMICs).

One exemplary embodiment comprises a method of wire bonding connection pads of a semiconductor package during fabrication. The method comprises securing a base of a dielectric structure to the semiconductor package. The method further comprises securing a bondwire to a first connection pad, extending the bondwire from the first connection pad around the dielectric structure a defined amount to a second connection pad to achieve an inductance between the first and second connection pads, and securing the bondwire to the second connection pad.

One exemplary embodiment comprises a semiconductor package comprising first and second connection pads and a bondwire inductor. The bondwire inductor comprises a dielectric structure comprising a base secured to the semiconductor package and a bondwire. A first end of the bondwire is secured to the first connection pad, while a second end of the bondwire, opposite the first end, is secured to the second connection pad. The bondwire extends from the first connection pad around the dielectric structure a defined amount to the second connection pad to achieve an inductance between the first and second pads.

In some exemplary embodiments, the defined amount comprises less than one full turn, e.g., a fraction of a turn, around the dielectric structure. In other exemplary embodiments, the defined amount comprises one or multiple turns around the dielectric structure.

In some exemplary embodiments, the semiconductor package comprises a Radio Frequency (RF) component with the bondwire inductor connected at an input to the RF component. In some exemplary embodiments, the semiconductor package comprises a circuit component, e.g., a Radio Frequency (RF) component, with the bondwire inductor connected at an output of the circuit component. In some exemplary embodiments, the semiconductor package comprises an RF component with a first bondwire inductor connected at an input to the circuit component and a second bondwire inductor connected at an output of the circuit component. Such bondwire inductor(s) may be part of, or may supplement, impedance control circuitry for the circuit component, e.g., impedance matching circuitry, frequency termination circuitry, and/or matching biasing circuitry.

BRIEF DESCRIPTION OF THE DRAWINGS

FIGS. 9A-9E show a dielectric structure in an open cavity package 160 according to exemplary embodiments of the solution presented herein.

DETAILED DESCRIPTION

Figure 1A:
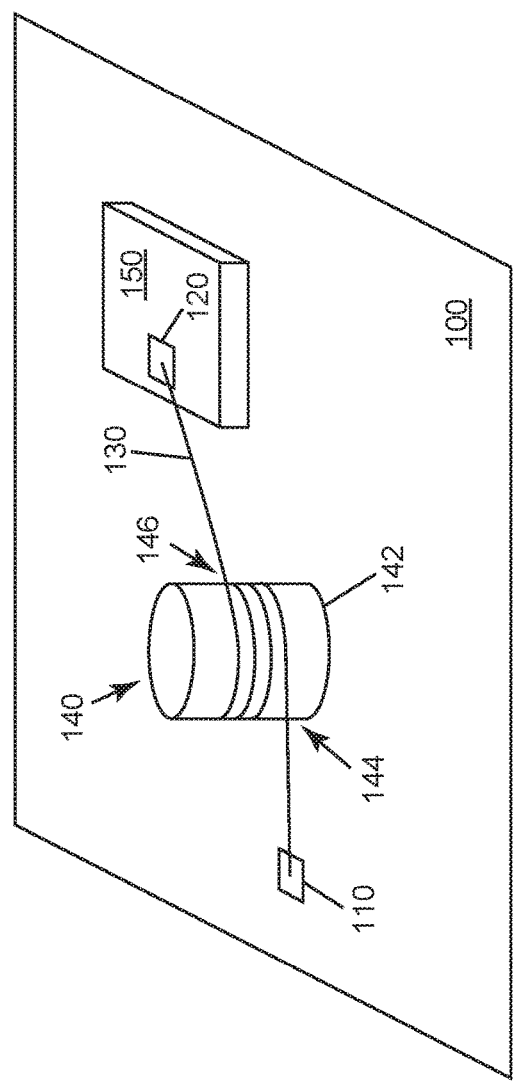
FIGS. 1A-1D show a schematic of semiconductor packages fabricated according to exemplary embodiments of the solution presented herein.
Figure 1B:
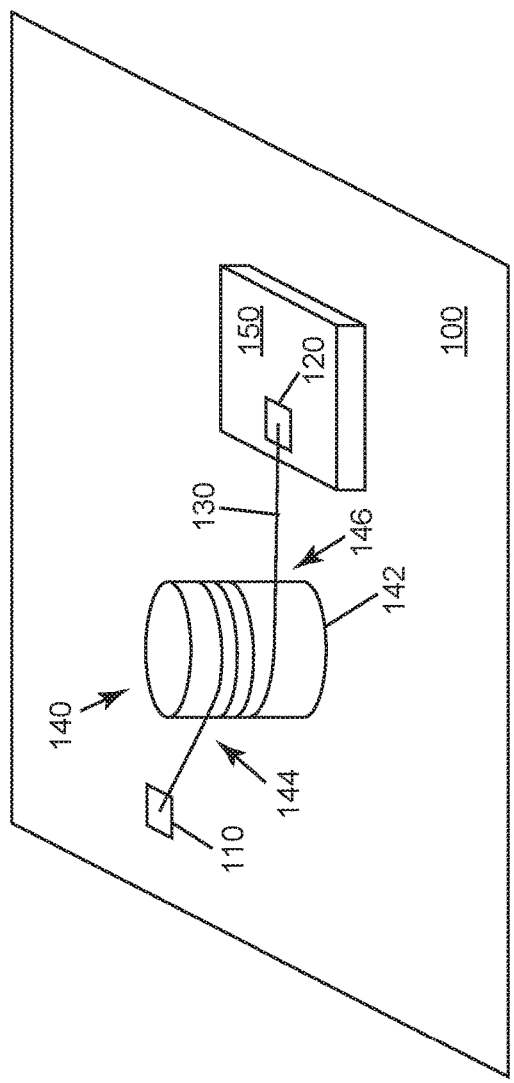
Figure 2:
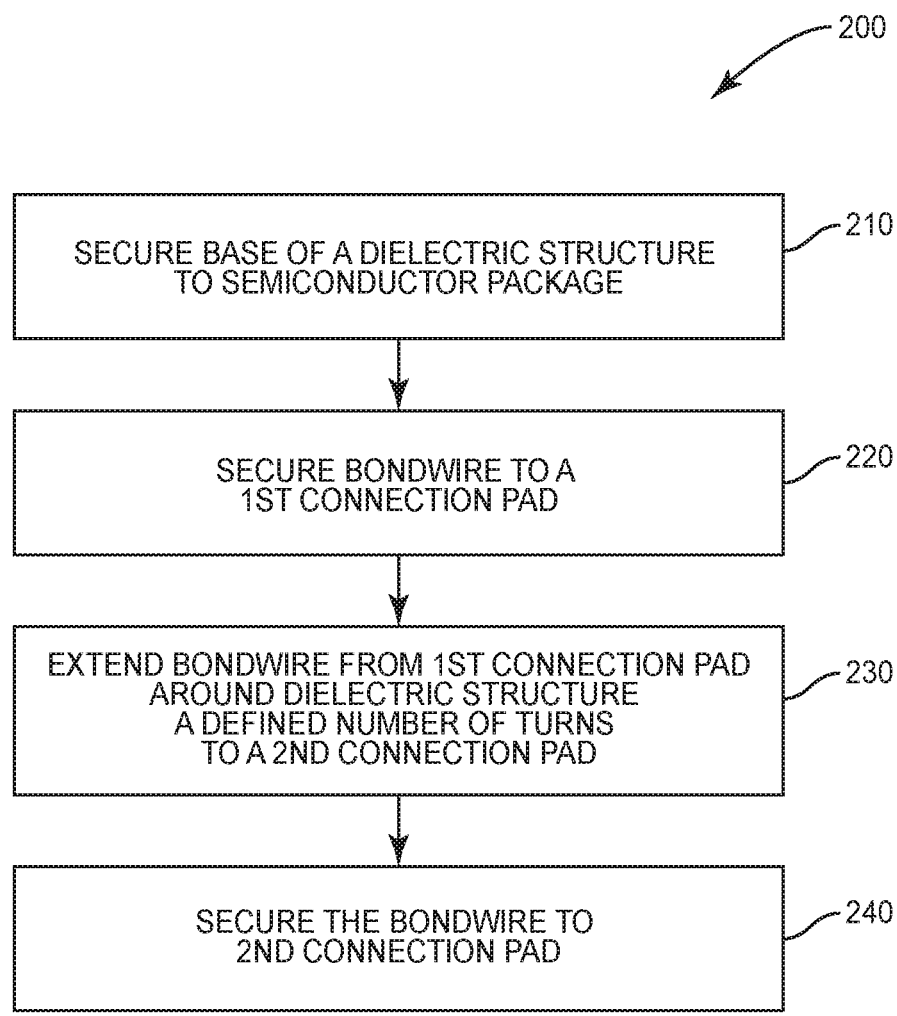
FIG. 2 shows a method of wire bonding connection pads of a semiconductor package according to exemplary embodiments of the solution presented herein.

FIGS. 1A and 1B show simple schematics of a semiconductor package 100 according to exemplary embodiments of the solution presented herein, while FIG. 2 shows an exemplary fabrication method 200 for connecting connection pads of the semiconductor package 100 during a wire bonding fabrication process. As shown in FIGS. 1A and 1B, semiconductor package 100 comprises connection pads 110, 120, bondwire 130, and dielectric structure 140. While FIGS. 1A and 1B show connection pad 120 as being part of a component 150, e.g., a semiconductor device, an integrated circuit, an integrated passive device, etc., it will be appreciated that connection pad 120 may alternatively be disposed elsewhere on the semiconductor package 100 or as part of another structure, e.g., an intermediate integrated passive device (IPD). As such, component 150 is for illustrative purposes only, and should not be construed as limiting.

The solution presented herein connects the connection pads 110, 120 using the wire bonding method 200 of FIG. 2. The method 200 comprises securing a base 142 of the dielectric structure 140 to the semiconductor package 100 (block 210). For example, the base 142 may be secured to a surface of the semiconductor package 100 or in the semiconductor package 100. The method 200 further comprises securing the bondwire 130 to a first connection pad 110, 120 (block 220). The method 200 further comprises extending the bondwire 130 from the first connection pad 110, 120 around the dielectric structure 140 a defined amount to a second connection pad 110, 120 to achieve an inductance between the first and second connection pads 110, 120 (block 230), and securing the bondwire 130 to the second connection pad 110, 120 (block 240). As shown in FIG. 1A, the first connection pad 110, 120 may comprise pad 110, and the second connection pad 110, 120 may comprise pad 120. Alternatively, as shown in FIG. 1B, the first connection pad 110, 120 may comprise pad 120, and the second connection pad 110, 120 may comprise pad 110. In both embodiments, the fabrication method extends the bondwire 130 around the dielectric structure starting at a wrapping start point 144 proximate the base 142 of the dielectric structure 140 and ending at a wrapping end point 146 higher along the height of the dielectric structure 140 than the wrapping start point 144.

Figure 1C:
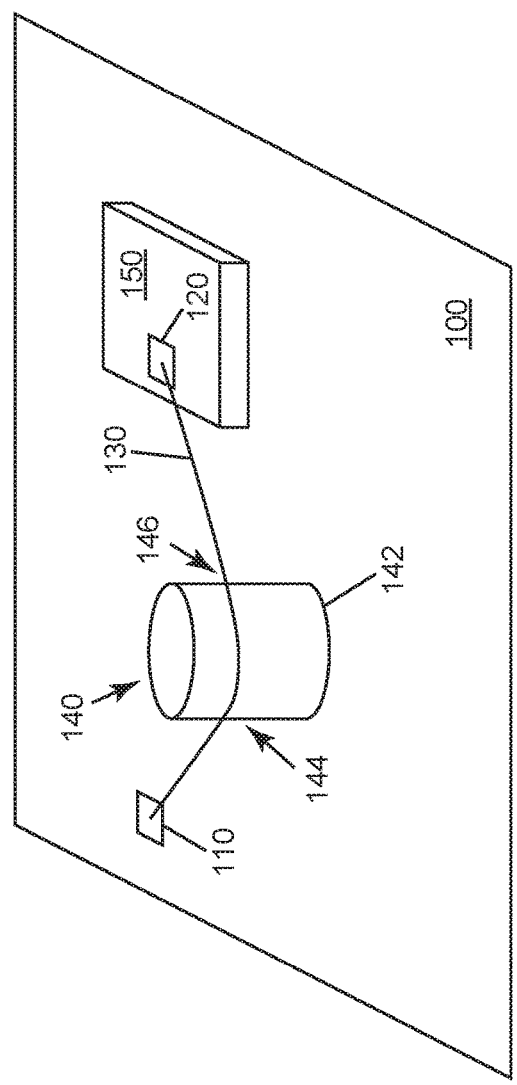
Figure 1D:
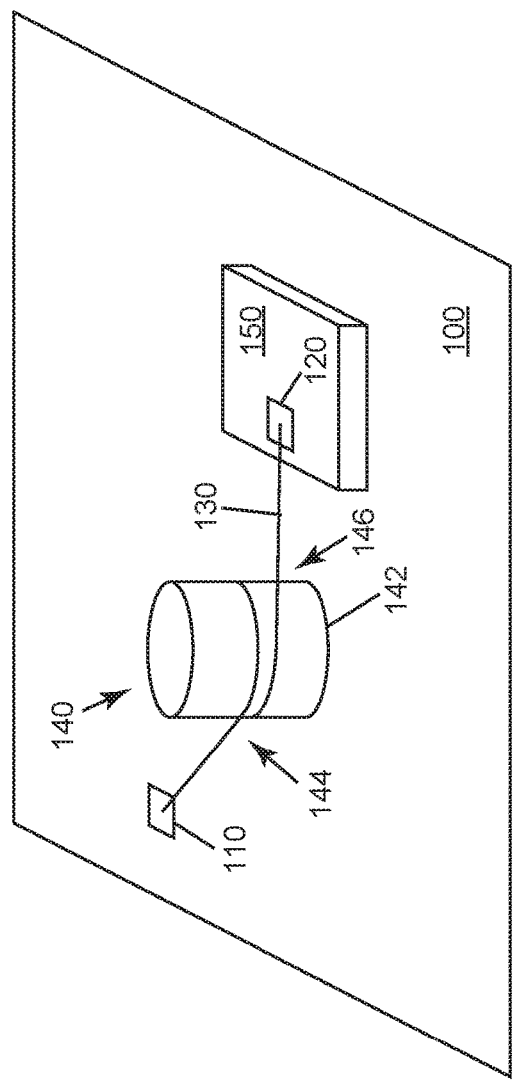

As shown in FIGS. 1A and 1B, the defined amount the bondwire 130 wraps around the dielectric structure 140 may comprise multiple turns around the dielectric structure. However, FIGS. 1A and 1B show multiple turns for illustrative purposes only. It will be appreciated that the defined amount may be less than one full turn (e.g., ¼ turn or ¾ turn) as shown, e.g., in FIG. 1C, may be one full turn as shown, e.g., in FIG. 1D, or may be more than one turn as shown in FIGS. 1A and 1B. It will further be appreciated that the location of the connection pads 110, 120 relative to the dielectric structure 140 may be defined based on how much the bondwire extends around the dielectric structure 140.

The desired inductance dictates the defined amount the bondwire 130 wraps around a particular dielectric structure 140. It will be appreciated that each dielectric structure 140 is constructed from a particular material or materials, resulting in a particular dielectric constant for that dielectric structure 140, which contributes to the inductance achieved by wrapping the bondwire 130 around the dielectric structure 140 the defined amount. It will further be appreciated that a particular dielectric structure 140 has a size and/or shape that further contributes to the inductance achieved by wrapping the bondwire 130 around the dielectric structure 140 the defined amount. Additional fabrication details that may also contribute to the total inductance of the bondwire inductor include, but are not limited to, the proximity of a wire bond to a ground plane of the semiconductor package 100, the total length of the bondwire 130, the material of the bondwire 130 (e.g., gold, copper, etc.), how tightly the bondwire 130 is wrapped around the dielectric structure 140, the spacing between adjacent turns of the bondwire 130 on the dielectric structure 140, etc. Further, in addition to defining the inductance of the dielectric structure 140, these factors also determine the associated parasitic capacitance and resonance of the bondwire inductor, all of which are relevant to the overall operation of the bondwire inductor and any associated components.

Figure 3B:
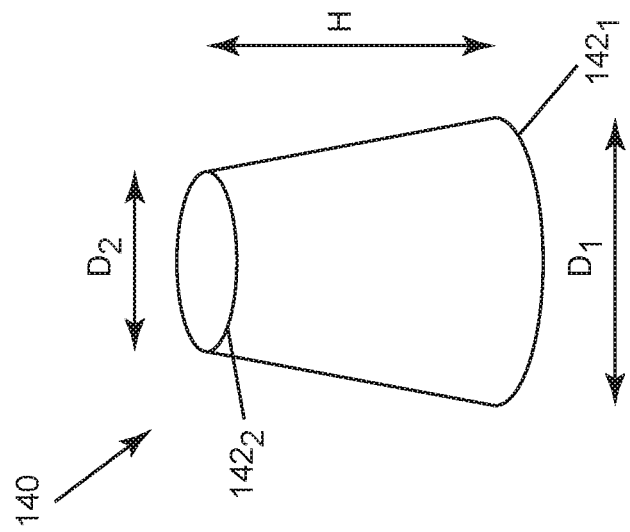
FIGS. 3A-3B show dielectric structures according to exemplary embodiments of the solution presented herein.
Figure 3A:
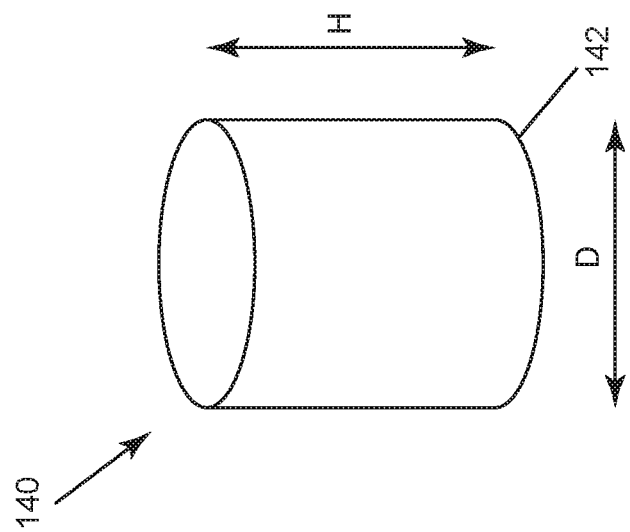

In some exemplary embodiments, the dielectric structure 140 comprises a solid structure made from a dielectric material, e.g., ceramic, glass, plastic, mica, ferrite, etc. Such solid dielectric structures 140 may comprise any shape. FIG. 3A shows one exemplary dielectric structure 140 comprising a cylindrical dielectric structure having a height H extending from a base 142 having a diameter D. FIG. 3B shows another exemplary dielectric structure 140 comprising a conical dielectric structure having a height H extending between a first base $142_1$ having a first diameter $D_1$ and a second base $142_2$ having a second diameter $D_2$, smaller than the first diameter $D_1$.

Figure 4:
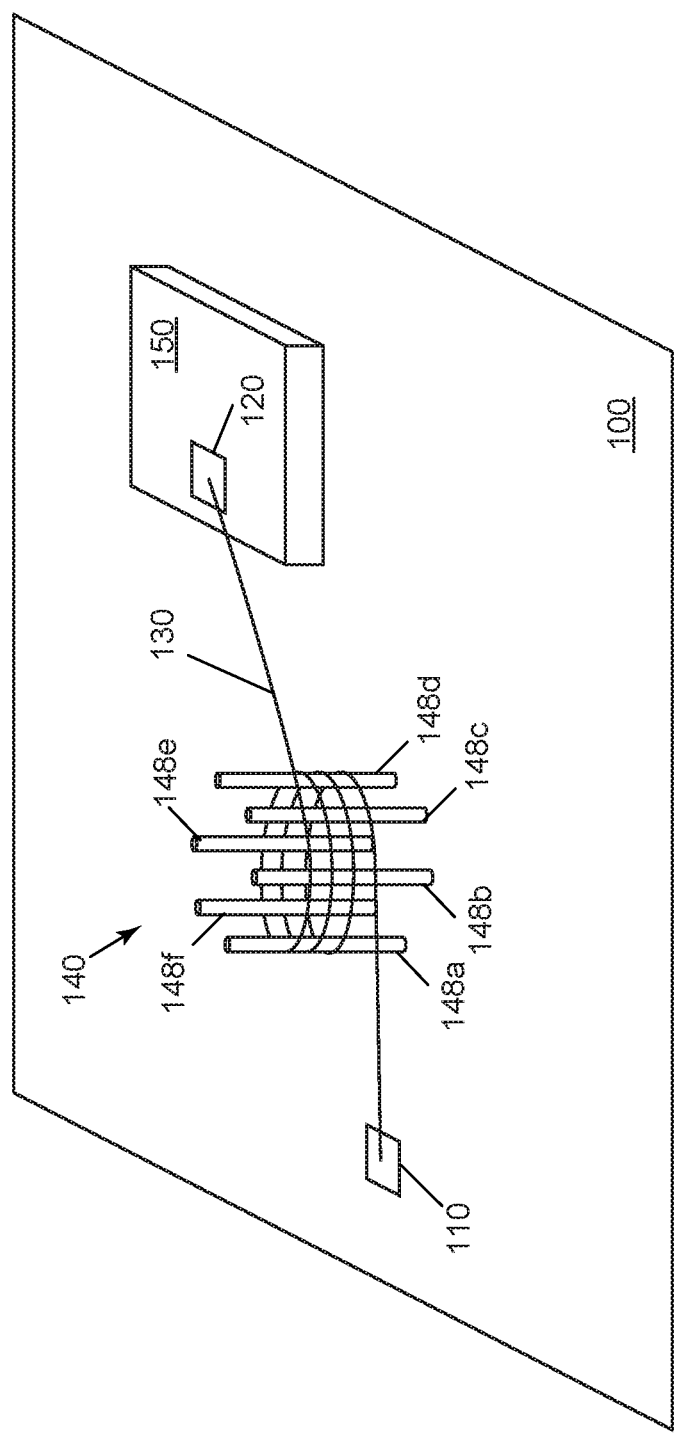
FIG. 4 shows a schematic of semiconductor packages fabricated according to exemplary embodiments of the solution presented herein.
Figure 5:
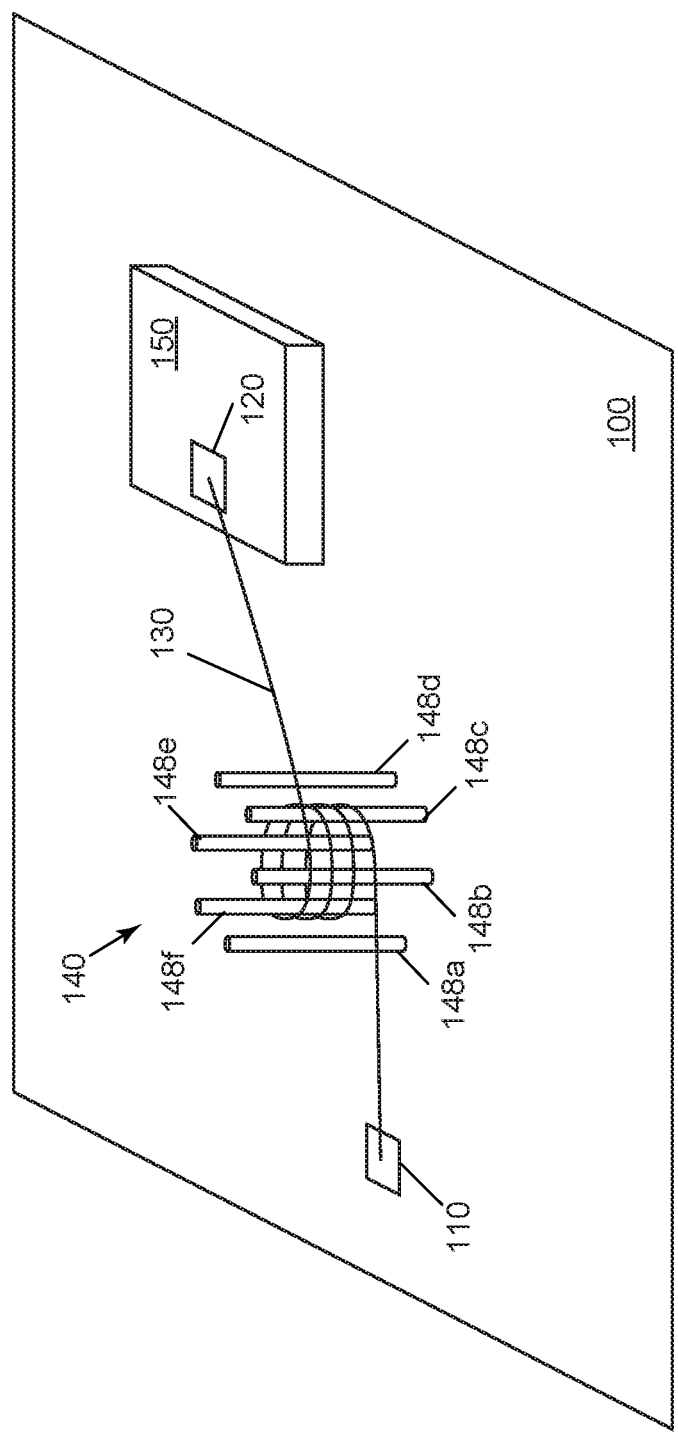
FIG. 5 shows a schematic of semiconductor packages fabricated according to exemplary embodiments of the solution presented herein.
Figure 6:
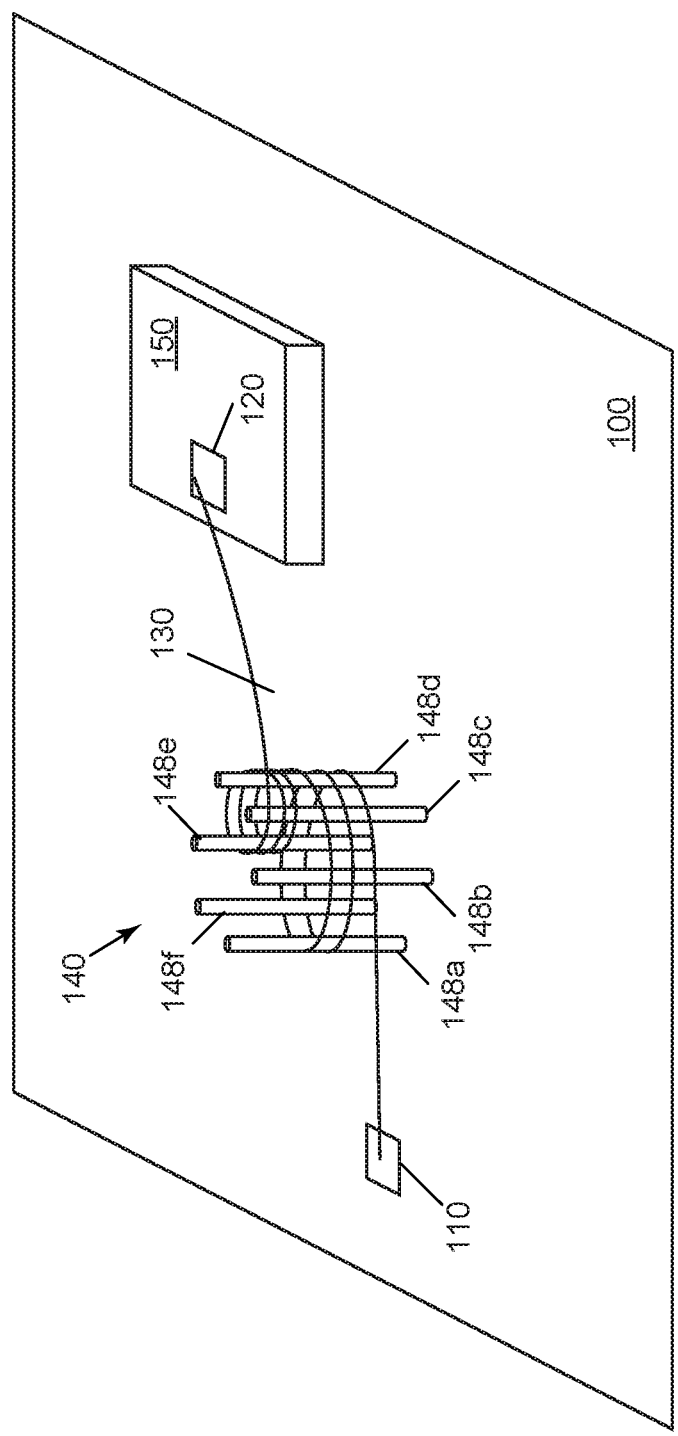
FIG. 6 shows a schematic of semiconductor packages fabricated according to exemplary embodiments of the solution presented herein.

In other exemplary embodiments, dielectric structure 140 may comprise an open air shape bounded by a plurality of dielectric posts 148, where the dielectric constant for the dielectric structure 140 is defined by the dielectric constant of air and the dielectric constant(s) of the posts 148. As shown in FIGS. 4-6, the dielectric posts 148 may comprise cylindrical posts. It will be appreciated, however, that the solution presented herein is not limited to cylindrical posts, and that other shaped posts may be used, e.g., posts having a conical shape, a rectangular shape, a triangular shape, etc. Further, it will be appreciated that any number of dielectric posts 148 may be used to create a dielectric structure 140 of any desired shape, where the number of posts and the shape created by the dielectric posts 148 contributes to the total inductance achieved by the bondwire inductor. Thus, the six dielectric posts 148 of FIGS. 4-6, and the corresponding cylindrical shape(s) are for illustrative purposes only, and should not be construed as limiting.

FIG. 4 shows one exemplary embodiment where the dielectric structure 140 comprises a cylindrical shape defined by six dielectric posts 148a-f. For this embodiment, the wire bonding method extends the bondwire 130 from the first connection pad 110, wraps the bondwire 130 around the perimeter defined by the posts 148a-f a defined amount, e.g., multiple turns, and then secures the bondwire 130 to the second connection pad 120.

FIG. 5 shows an embodiment where the dielectric structure 140 comprises the six dielectric posts 148a-f of FIG. 4. For this embodiment, however, the wire bonding method extends the bondwire 130 from the first connection pad 110, wraps the bondwire 130 around a perimeter defined by fewer than all six posts, e.g., posts 148b, 148c, 148e, 148f, and then secures the bondwire 130 to the second connection pad 120. As demonstrated by the embodiments of FIGS. 4 and 5, when the dielectric structure 140 is constructed with dielectric posts 148, the fabrication method may select some number of the posts to selectively construct a bondwire inductor with a desired size (e.g., diameter) and/or shape. Thus, the post embodiments (e.g., FIGS. 4 and 5) provide additional flexibility for controlling the inductance during fabrication of the semiconductor package 100.

FIG. 6 shows an embodiment where the dielectric structure 140 comprises the six dielectric posts 148a-f of FIG. 4. For this embodiment, however, the wire bonding method creates the desired impedance using multiple different sizes of the dielectric structure 140. More particularly, the wire bonding method extends the bondwire 130 from the first connection pad 110, wraps the bondwire 130 around a first perimeter defined by a first set of the posts 148 a first amount (e.g., three turns around posts 148a-f in FIG. 6), continues by wrapping the bondwire 130 around a second perimeter defined by a second set of the posts a second amount (e.g., two turns around posts 148c-e), and then secures the bondwire 130 to the second connection pad 120. It will be appreciated that the particular posts in each subset and the number of wraps around each subset of posts are shown for illustrative purposes, and should not be construed as limiting.

Figure 7:
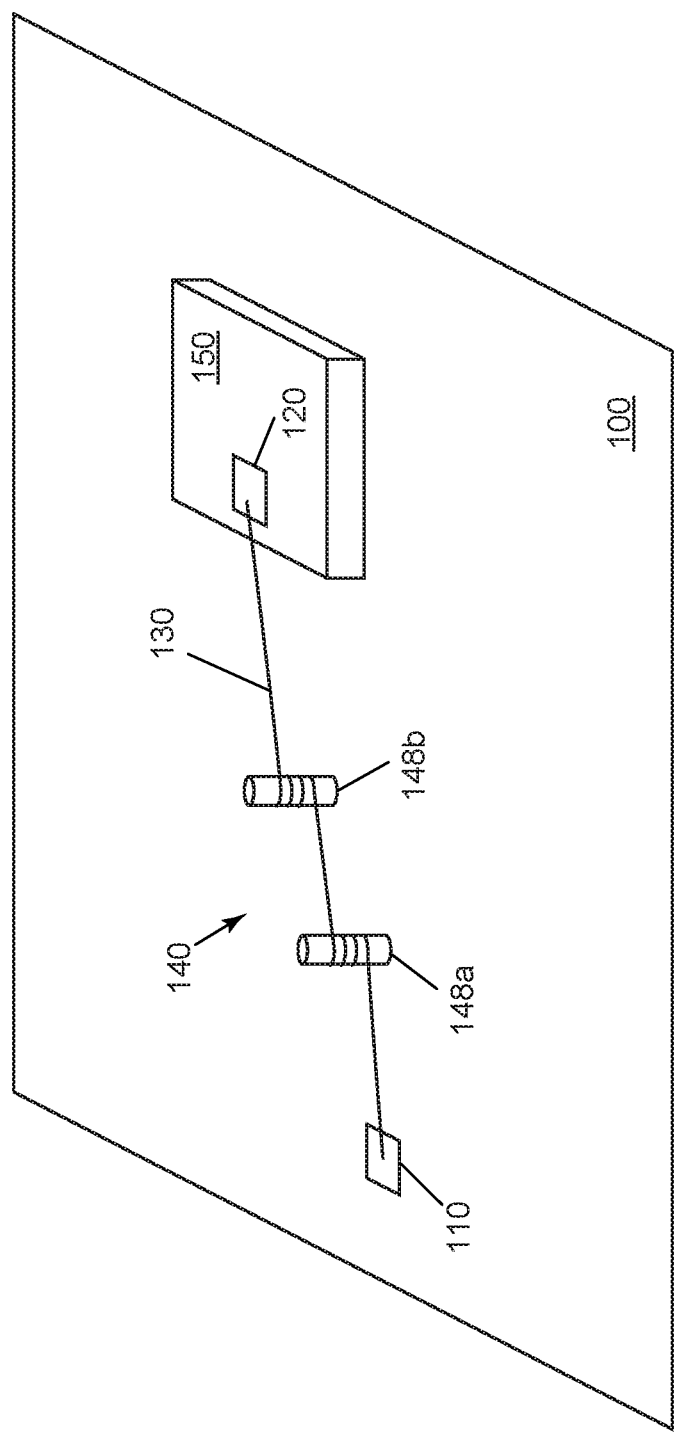
FIG. 7 shows a schematic of semiconductor packages fabricated according to exemplary embodiments of the solution presented herein.

The embodiment of FIG. 6 demonstrates one embodiment that serially connects multiple inductors (defined by different subsets of dielectric posts 148) to fabricate a bondwire inductor with the desired inductance. FIG. 7 shows another exemplary embodiment that serially connects multiple inductors to generate the desired inductance. As shown in FIG. 7, the desired inductance may be achieved via a bondwire inductor comprising the bondwire 130 wrapping around a first post 148a a first desired amount followed by the bondwire 130 wrapping around a second post 148b a second desired amount to achieve the desired inductance. It will be appreciated that posts 148a, 148b of FIG. 7 may alternatively be constructed using smaller posts defining each perimeter, e.g., as shown in FIGS. 4-6. Further, it will be appreciated that the number of turns, the spacing between the turns, the distance between the posts, and the diameter(s) of the dielectric structure 140 and/or posts 148 is illustrative only, and is not to be construed as limiting.

Figure 8:
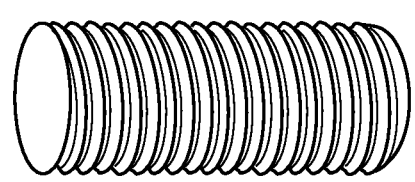
FIG. 8 shows a dielectric structure according to exemplary embodiments of the solution presented herein.

FIGS. 1-7 all illustrate the solution presented herein using dielectric structures 140 having relatively smooth external surfaces. It will be appreciated that the solution presented herein is not limited to such, and that a dielectric structure 140 may comprise ridges, shelves, grooves, or some type of support structure. Such a support structure may be configured to define where/how the bondwire 130 wraps around the dielectric structure 140 to aid in the wire separation necessary to achieve a desired inductance (e.g., a change in elevation every quarter revolution). For example, the exterior of an exemplary dielectric structure 140 may comprise a screw pattern as shown in FIG. 8, where a bondwire 130 rests on the ledges of the screw pattern as it wraps around the dielectric structure 140. While not shown, it will be appreciated that in another example, the exterior of an exemplary dielectric structure 140 may comprise a groove pattern, where a bondwire 130 rests within the grooves as it wraps around the dielectric structure 140.

Figure 9A:
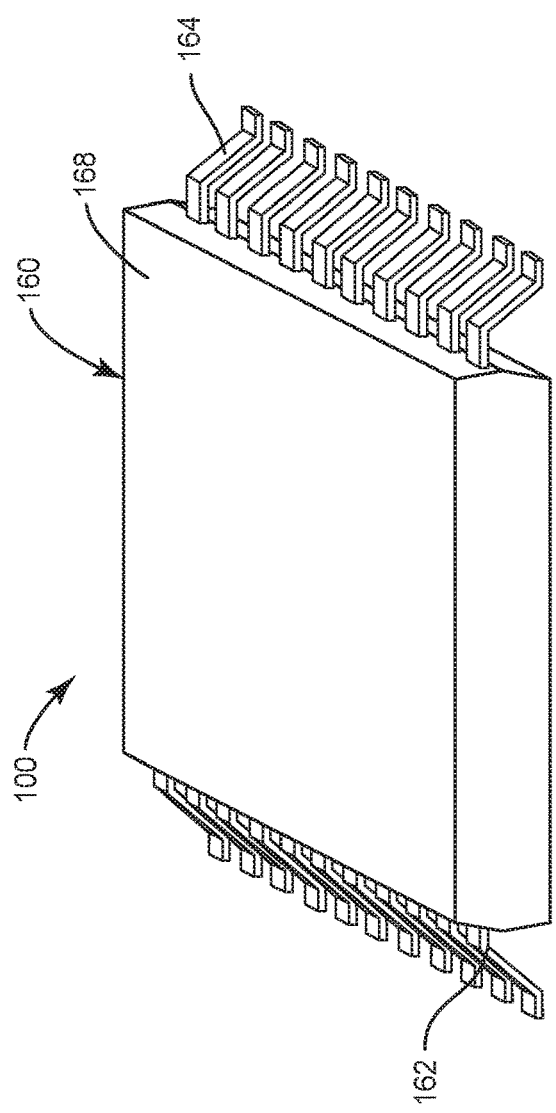
Figure 9B:
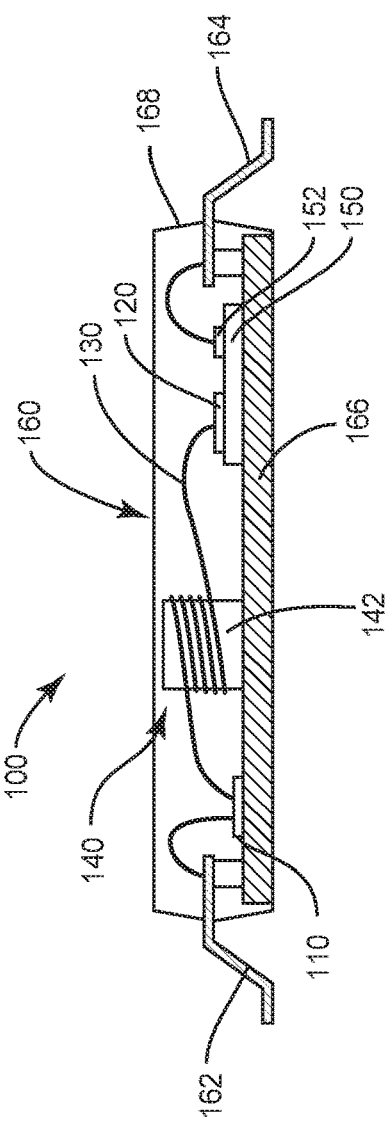

It will be appreciated that the semiconductor package 100 may further be mounted within an open cavity package 160. FIG. 9A shows an external view of an exemplary open cavity package 160, which includes a plurality of connection leads that electrically connect to internal components of the semiconductor package. The package 160 includes a first connection lead 162, a second connection lead 164, a metal flange 166, and a sidewall and lid 168, e.g., made out of ceramic or plastic. The first connection lead 162 connects to pad 110, while the second connection lead 164 connects to pad 152 on component 150. The pad 110, dielectric structure 140, and component 150 are mounted on the upper surface of the metal flange 166 in a cavity formed by the metal flange 166 and the sidewall and lid 168. In one exemplary embodiment, air fills the cavity formed by the metal flange 166 and the sidewall and lid 168. In other exemplary embodiments, dielectric materials may be used to further secure the elements of the semiconductor package, and may fill part or all of the cavity formed by the metal flange 166 and the sidewall and lid 168.

In some exemplary embodiments, the metal flange 166 may act as a heat sink that dissipates heat that is generated in the component 150. This heat may be transferred though vias (not shown) in component 150 and/or other semiconductor layer structures (not shown) of the component 150 to the metal flange 166.

It will be appreciated that the shape and size of the sidewall and lid 168, e.g., shown in FIGS. 9B-9E, is for illustrative purposes only. Other shapes and/or sizes may be used to accommodate the components of the semiconductor package 100.

The bondwire inductors disclosed herein may be constructed at an input and/or an output of a component 150, e.g., as shown in FIGS. 9B-9E. It will be appreciated that such implementations may be fabricated with or without the open cavity package 160. Such bondwire inductors may be part of, or supplemental to, any circuitry that supports the operation of the component 150 and/or the overall operation of the semiconductor package 100. Such supporting circuitry includes, but is not limited to impedance matching circuitry, harmonic termination circuitry (e.g., for $2^{nd}$ order or higher order harmonics), matching biasing circuitry, etc. For example, a bondwire inductor according to exemplary embodiments disclosed herein may be fabricated to connect an input of a component 150 (e.g., connection pad 120) to an external lead 162 of the semiconductor package 100 via connection pad 110 (e.g., FIG. 9B) and/or to connect an output of a component 150 (e.g., connection pad 152) to an external lead of the semiconductor package 100 via connection pad 110 (e.g., FIG. 9C). As shown in FIG. 9D, the semiconductor package 100 may also include multiple bondwire inductors, e.g., connected at an input and an output of a component 150. It will further be appreciated that the bondwire inductor disclosed herein may be used to connect components within the package 160, e.g., as shown in FIG. 9E.

Exemplary components 150 associated with the bondwire inductors disclosed herein may include, but are not limited to, Radio frequency (RF) amplifiers as well as the supporting circuitry for such RF amplifiers, e.g., impedance matching circuits, harmonic termination circuits, matching biasing circuits, etc., such as may be used for the RF amplifiers. Exemplary RF amplifiers include, but are not limited to, silicon-based RF amplifiers, e.g., RF amplifiers implemented using Laterally Diffused Metal Oxide Semiconductor (LDMOS) transistors, and Group III nitride-based RF amplifiers, e.g., RF amplifiers implemented using High Electron Mobility Transistors (HEMTs). The bondwire inductors disclosed herein may be constructed to supplement and/or improve input and/or output impedance matching, harmonic termination, etc., and thus to improve performance of LDMOS transistors and/or HEMT.

The solution presented herein adds an inductance between connection pads of a semiconductor package 100 using a bondwire inductor fabricated to connect the connection pads. As discussed herein, the bondwire inductor may have a fixed inductance, e.g., defined by the amount the bondwire 130 extends around a fixed dielectric structure 140, or may have a selectable inductance, e.g., defined by selectively spacing the bondwire 130 around a fixed dielectric structure 140, by wrapping the bondwire 130 around selected ones of a plurality of posts 148, etc. By connecting connection pads using a bondwire inductor, the solution presented herein provides the desired inductance at a desired location of the semiconductor package 100. In so doing, the bondwire inductors fabricated for semiconductor package 100 as disclosed herein may be part of (or may supplement) any type of impedance controlling circuitry, e.g., impedance matching circuitry, harmonic termination circuitry, matching biasing circuitry, etc., which improves the performance of the components of the semiconductor package 100. Further, by fabricating the bondwire inductors as disclosed herein (e.g., with a wire bonding process), the solution presented herein provides a desired inductance for a particular connection within the semiconductor package 100 with reduced parasitic capacitance, and without negatively impacting the package size, e.g., without requiring increased height of a corresponding open cavity package 160. In addition, the solution presented herein enables the incorporation of bondwire inductor(s) during fabrication of the semiconductor package 100, which avoids problems typically associated with post-fabrication modifications of semiconductor packages, e.g., broken wires, damaged connection pads, increased parasitic capacitance, etc., that are more likely when external components, e.g., external inductors, are added to a semiconductor package via post fabrication techniques.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A semiconductor package comprising:
   a surface and;
   Radio Frequency (RF) amplifier circuitry comprising:
      a first RF component comprising a first connection pad;
      a second RF component comprising a second connection pad; and
      at least one bondwire inductor that comprises:
         a dielectric structure comprising a base secured to the surface of the semiconductor package; and
         a bondwire interconnecting the first and second RF components, the bondwire comprising:
            a first end secured to the first connection pad; and
            a second end opposite the first end secured to the second connection pad;
      wherein the bondwire extends from the first connection pad at least partially around the dielectric structure a defined amount to the second connection pad to achieve an inductance between the first and second connection pads supporting impedance matching, harmonic termination, and/or biasing of input to, or output from, the RF amplifier circuitry.

2. The semiconductor package of claim 1 wherein the dielectric structure comprises a cylindrical dielectric structure having a diameter at the base and a height extending from the base, and wherein the base of the dielectric structure is secured to the semiconductor package such that the height of the cylindrical dielectric structure extends upward from the semiconductor package.

3. The semiconductor package of claim 1 wherein the dielectric structure comprises a conical dielectric structure comprising:
   a first diameter at the base;
   a second diameter at a second base and shorter than the first diameter; and
   a height extending upward from the semiconductor package between the base and the second base.

4. The semiconductor package of claim 1 wherein the bondwire extends from the first connection pad around the dielectric structure the defined amount to the second connection pad by:
   extending the bondwire from the first connection pad towards a wrapping start point proximate the base of the dielectric structure;
   wrapping the bondwire around the dielectric structure from the wrapping start point upwards along a height of the dielectric structure the defined amount to a wrapping end point; and
   extending the bondwire from the wrapping end point to the second connection pad.

5. The semiconductor package of claim 1 wherein the bondwire extends from the first connection pad around the dielectric structure the defined amount to the second connection pad by:
   extending the bondwire from the first connection pad towards a wrapping start point proximate a top of the dielectric structure;
   wrapping the bondwire around the dielectric structure from the wrapping start point downwards along a height of the dielectric structure the defined amount to a wrapping end point; and
   extending the bondwire from the wrapping end point to the second connection pad.

6. The semiconductor package of claim 1 wherein the first connection pad comprises a package connection pad secured to the semiconductor package and the second connection pad comprises a device connection pad secured to a semiconductor device secured to the semiconductor package.

7. The semiconductor package of claim 1 wherein the dielectric structure comprises a plurality of dielectric posts, each comprising a respective base secured to the semiconductor package according to a predetermined pattern.

8. The semiconductor package of claim 7 wherein the bondwire extends from the first connection pad around the dielectric structure the defined amount to the second connection pad by extending the bondwire from the first connection pad around a perimeter defined by the plurality of dielectric posts the defined amount to the second connection pad.

9. The semiconductor package of claim 7 wherein the bondwire extends from the first connection pad around the dielectric structure the defined amount to the second connection pad by extending the bondwire from the first connection pad around a perimeter defined by two or more of the plurality of dielectric posts the defined amount to the second connection pad.

10. The semiconductor package of claim 7:
    wherein the bondwire extends from the first connection pad around the dielectric structure the defined amount to the second connection pad by extending the bondwire from the first connection pad around a first one or more of the plurality of dielectric posts a first amount, and from the first one or more of the plurality of dielectric posts around a second one or more of the plurality of dielectric posts a second amount to the second connection pad to achieve the inductance between the first and second connection pads.

11. The semiconductor package of claim 7 wherein the bondwire extends from the first connection pad around the dielectric structure the defined amount to the second connection pad by:
    extending the bondwire from the first connection pad around a first perimeter defined by a first subset of the plurality of dielectric posts a first amount to a first perimeter stop point; and
    extending the bondwire from the first perimeter stop point around a second perimeter defined by a second subset of the plurality of dielectric posts a second amount to the second connection pad to achieve the inductance between the first and second connection pads.

12. The semiconductor package of claim 1 wherein the defined amount is less than one full turn around the dielectric structure.

13. The semiconductor package of claim 1 further comprising an open cavity package comprising a metal flange, a sidewall, and a lid, wherein the bondwire inductor is secured to the metal flange, and wherein the first and second connection pads and the bondwire inductor are disposed within the open cavity package and are surrounded by the sidewall and the lid.

14. The semiconductor package of claim 1 wherein the RF amplifier circuitry further comprises an input and an output.

15. The semiconductor package of claim 14 wherein the at least one bondwire inductor connects to the output of the RF amplifier circuitry and is configured as part of at least one of an output impedance matching circuit, an output harmonic termination circuit, and an output matching biasing circuit for the output of the RF amplifier circuitry.

16. The semiconductor package of claim 14 wherein a first one of the at least one bondwire inductor connects to the input of the RF amplifier circuitry and is configured as part of at least one of an input impedance matching circuit, an input harmonic termination circuit, and an input matching biasing circuit for the input of the RF amplifier circuitry.

17. The semiconductor package of claim 16 wherein a second one of the at least one bondwire inductor connects to the output of the RF amplifier circuitry and is configured as part of at least one of an output impedance matching circuit, an output harmonic termination circuit, and an output matching biasing circuit for the output of the RF amplifier circuitry.

18. The semiconductor package of claim 1 wherein the dielectric structure comprises a conical dielectric structure comprising:
 a first diameter at the base;
 a second diameter at a second base and longer than the first diameter; and
 a height extending upward from the semiconductor package between the base and the second base.

* * * * *